United States Patent
Brand et al.

(10) Patent No.: US 8,510,934 B2
(45) Date of Patent: Aug. 20, 2013

(54) METHOD OF MANUFACTURING A FLEXIBLE ELECTRONIC PRODUCT

(75) Inventors: Jeroen van den Brand, Goirle (NL); Andreas Heinrich Dietzel, Kempen (DE)

(73) Assignee: Nederlandse Organisatie voor toegepast-natuurwetenschappelijk onderzoek TNO (NL)

( * ) Notice: Subject to any disclaimer, the term of this patent is extended or adjusted under 35 U.S.C. 154(b) by 0 days.

(21) Appl. No.: 13/140,387

(22) PCT Filed: Dec. 16, 2009

(86) PCT No.: PCT/NL2009/050770
§ 371 (c)(1),
(2), (4) Date: Jun. 16, 2011

(87) PCT Pub. No.: WO2010/071426
PCT Pub. Date: Jun. 24, 2010

(65) Prior Publication Data
US 2012/0006464 A1    Jan. 12, 2012

(30) Foreign Application Priority Data

Dec. 17, 2008 (EP) .................................. 08171990

(51) Int. Cl.
*H01R 43/00* (2006.01)
(52) U.S. Cl.
USPC .................. 29/825; 29/830; 29/840
(58) Field of Classification Search
USPC .................. 29/825, 830, 832, 840
See application file for complete search history.

(56) References Cited

U.S. PATENT DOCUMENTS

| | | | |
|---|---|---|---|
| 5,055,968 A * | 10/1991 | Nishi et al. | 361/737 |
| 5,411,918 A | 5/1995 | Keible et al. | |
| 5,566,441 A * | 10/1996 | Marsh et al. | 29/600 |
| 5,671,525 A * | 9/1997 | Fidalgo | 29/600 |
| 5,847,968 A * | 12/1998 | Miura et al. | 716/123 |
| 6,303,655 B1 * | 10/2001 | Takehana et al. | 514/563 |
| 7,759,167 B2 * | 7/2010 | Vanfleteren et al. | 438/118 |
| 2003/0059984 A1 | 3/2003 | Sirringhaus et al. | |
| 2004/0094830 A1 | 5/2004 | Vu et al. | |
| 2005/0045379 A1 | 3/2005 | Sakurai et al. | |
| 2006/0056161 A1 | 3/2006 | Shin et al. | |
| 2007/0113305 A1 | 5/2007 | Bauer et al. | |
| 2007/0134849 A1 * | 6/2007 | Vanfleteren et al. | 438/123 |
| 2007/0230103 A1 | 10/2007 | Baumann et al. | |
| 2008/0052904 A1 | 3/2008 | Schneider et al. | |

* cited by examiner

FOREIGN PATENT DOCUMENTS

| | | |
|---|---|---|
| EP | 1811565 | 7/2005 |
| GB | 2313713 | 12/1997 |
| WO | WO9202038 | 2/1992 |
| WO | WO0221595 | 3/2002 |

OTHER PUBLICATIONS

International Search Report for PCT/NL2009/050770, mailed Feb. 17, 2010.

*Primary Examiner* — Carl Arbes
(74) *Attorney, Agent, or Firm* — Waddey & Patterson, P.C.; Rebecca M. Barnett; James R. Cartiglia (57) ABSTRACT

A method is described for manufacturing a flexible electronic product, the method comprising the steps of—providing (S1) a flexible foil (10; 110) with a first and a second, mutually opposite main side (11, 12; 111, 112),—placing (S2) a component (30; 130) at the first foil at the first main side (11; 111), the component having at least one electrical terminal (31; 131) facing towards the second main side (12; 112)—estimating (S3) a position of the at least one electrical terminal (131),—adaptively forming (S4) a conductive path (40A, 40B, 40C) to the at least one electrical terminal, based on said estimated position.

14 Claims, 9 Drawing Sheets

METHOD OF MANUFACTURING A FLEXIBLE ELECTRONIC PRODUCT

BACKGROUND OF THE INVENTION

1. Field of the invention

The present invention relates to a flexible electronic product. The present invention further relates to a method for manufacturing a flexible electronic product.

2. Related Art

Flexible electronic products become more and more important, for example in the form of smart textiles, flexible displays and the like. Flexible electronic products mostly require the incorporation of semiconductor devices to steer and monitor various aspects of the device. As electronic devices generally become more and more complex, also the chips that steer them tend to become more and more complex. This results in higher IO counts, lower pitches and linewidths. This will in turn also result in higher requirements towards the placement accuracy of the integrated circuit when bonding. Apart from semiconductor devices other electric components, like batteries may have to be integrated with the flexible electronic product. These semiconductor devices and other electric components have a substantially smaller size than the surface at which they are mounted. This prohibits the use of machinery that is normally used to laminate various foils together. Instead placement devices have to be used to place these electric components.

EP1811565 describes a method for embedding an integrated circuit in a flexible electronic product. The method described therein involves forming a first flexible film on a rigid carrier substrate, attaching a die to the flexible film, so as to leave contacts on the die exposed, forming a wiring layer to contact the contacts of the die, and releasing the flexible film where the die is attached, from the carrier.

A roll to roll manufacturing process is desired. Potentially this allows assembly of the electronic product in large sizes and quantities at low costs, e.g. using production processes such as presently used in the paper printing industry. The flexible electronic product may be manufactured on different locations and the system may be assembled on a central location.

However, because the known method involves using a temporary rigid carrier it is difficult or not possible at all to carry out the known method as a roll to roll process. This is a disadvantage.

SUMMARY OF THE INVENTION

According to a first aspect of the invention, there is provided a method for manufacturing a flexible electronic product, the method comprising the steps of
  providing a flexible foil with a first and a second, mutually opposite main side,
  placing a component at the first foil at the first main side, the component having at least one electrical terminal facing towards the second main side
  estimating a position of the at least one electrical terminal with a computer vision system comprising a camera and a data processing system,
  adaptively forming a conductive path to the at least one electrical terminal, based on said estimated position.

According to a further aspect of the invention there is provided an apparatus for manufacturing a flexible electronic product, the apparatus comprising
  a first facility for providing a flexible foil with a first and a second, mutually opposite main side,
  a second facility for placing a component at the flexible foil at the first main side, the component having at least one electrical terminal facing towards the second main side,
  a third facility for estimating a position of the at least one electrical terminal, the third facility comprising a computer vision system comprising a camera and a data processing system,
  a fourth facility for adaptively forming a conductive path to the at least one electrical terminal, based on said estimated position.

The method and apparatus according to the present invention are suitable for implementation in a roll to roll process. Due to the estimation of the position of the at least one electric terminal and the subsequent adaptive formation of a conductive path to said terminal any inaccuracies caused by the roll to roll process can be compensated so that a reliable electric connection is obtained.

It is noted that US2005/045379 discloses a process that comprises the following steps
  Heat a resin film (S31)
  Place an electronic component (S32)
  Press-fit the electronic component into the resin film (S33)
  Cure the resin film (S34)
  Form grooves on the resin film (S35)
  Fill the grooves with conductive paste (S36)
  Cure the conductive paste (S37).

The cited US publication builds on Japanese Utility Model Publication No. S62-70473 (JPUM). This utility model teaches that electrical conductive lines having a narrow pitch can be made by forming grooves in a surface and filling said grooves with a conductive path. US2005/045379 teaches that electrodes of electronic components can be connected with said electronic parts by press fitting an electronic component into an insulating layer. According to a first embodiment either first a groove is formed and subsequently the electronic component is press-fitted so that an electrode thereof is exposed in the bottom of the groove at the opposite side, or according to a second embodiment first the electronic component is press-fitted and a groove is formed at the opposite side, therewith exposing an electrode of the electronic component. US2005/045379 teaches that the circuit patterns with which the electrodes are to be connected have a narrow pitch. Accordingly, as the first embodiment of the method is considered suitable this implies that US2005/045379 teaches also that the electronic component can be placed with high accuracy, otherwise it could not match the precision of the already present conductive pattern. US2005/045379 presents the both embodiments of the method as mutually equivalent. Nowhere is it suggested that the second embodiment of the method could have any advantage over the first embodiment. Furthermore US2005/045379 does not disclose that when applying the second embodiment of the method the actual position of the electronic component is estimated and that the conductive paths are adaptively formed based on said estimated actual position.

It is further noted that US2007/0113305 discloses an electrical device having carbonized conductors and a method and a device for the production thereof. Furthermore, there are situated between the electrical components regions made of plastic with conductors having carbonized plastic and/or agglomerated nanoparticles. The conductors are connected to the connections of components and/or to external connections of the electronic device. According to par. 17: "A method for the production of an electronic device including at least one electrical component having electrical connections is characterized by the following method steps. Firstly, the electrical component is arranged in a casting mold for plastic.

Afterward, a plastic is introduced into the casting mold in order to at least partially embed the electrical component in the plastic. Subsequently or synchronously, the method effects a method step of partial carbonization of the plastic and/or partial agglomeration of nanoparticles in the plastic to form conductors in a region. Energy of a focused and guided beam from an energy source is radiated in for this purpose."

It is further noted that GB2313713 discloses a high-density mounting method for making an electronic circuit board, wherein a stud bump is formed on a connection terminal of a semiconductor chip. The semiconductor chip is buried in a printed circuit board such that the stud bump has a height almost equal to that of a surface of the printed circuit board. It is also noted that US2006/056161 describes a flexible device, a flexible pressure sensor, and a fabrication method thereof. The flexible device includes: a first flexible substrate formed of a flexible material; an active element formed to have a predetermined thickness and flexibility, and being attached on the first flexible substrate; and a second flexible substrate formed of a flexible material to have a flexibility, and being deposited on the active element.

BRIEF DESCRIPTION OF THE DRAWINGS

These and other aspects are described in more detail with reference to the drawing. Therein:

FIG. 2B shows a top-view thereof, FIGS. 3A and 3B schematically show a second and a third step of the embodiment, therein FIG. 4C shows a detail of FIG. 4B, FIGS. 5A to 5C schematically show a fifth step of the embodiment, therein FIG. 5C shows a detail of FIG. 5B, FIGS. 6A, 6B show an optional further step of the embodiment of the method according to the invention, therein FIG. 8B shows a top-view thereof, FIGS. 9A and 9B schematically show a second step of the alternative embodiment, therein FIG. 9B shows a top-view thereof, FIGS. 10A and 10B schematically show a third step of the alternative embodiment, therein FIG. 10B shows a top-view thereof, FIGS. 11A, 11B and 11C schematically show a fourth step of the alternative embodiment, therein FIG. 11C shows an enlarged cross-section according to C-C in FIG. 11B, FIG. 12A schematically shows a step in a further alternative embodiment of a method according to the invention, FIG. 12B schematically shows a further step in said further alternative embodiment.

DETAILED DESCRIPTION OF EMBODIMENTS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Figure 1:
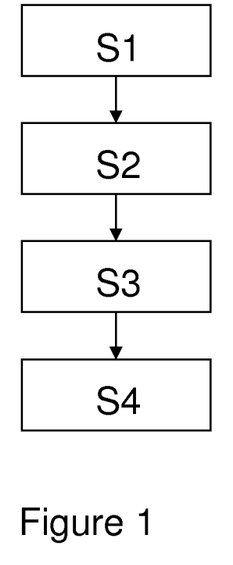
FIG. 1 schematically shows a method for manufacturing a flexible electronic product, FIGS. 2A and 2B schematically show a first step of an embodiment of the method, therein

FIG. 1 schematically shows a method for manufacturing a flexible electronic product. The method comprises the steps of
- providing (S1) a flexible foil with a first and a second, mutually opposite main side,
- placing (S2) a component at the first foil at the first main side, the component having at least one electrical terminal facing towards the second main side
- estimating (S3) a position of the at least one electrical terminal,
- adaptively forming (S4) a conductive path to the at least one electrical terminal, based on said estimated position.

An embodiment of the method is shown in more detail in FIGS. 2 to 6.

Figure 2A:
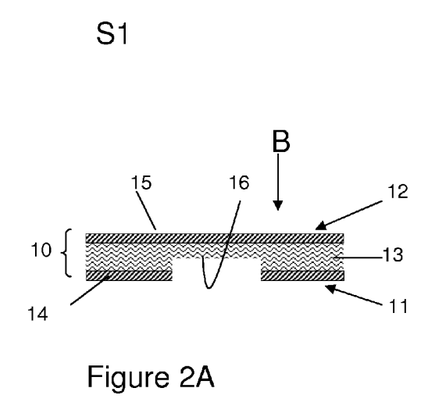
FIG. 2A shows a cross-section of an intermediate product resulting from said step.
Figure 2B:
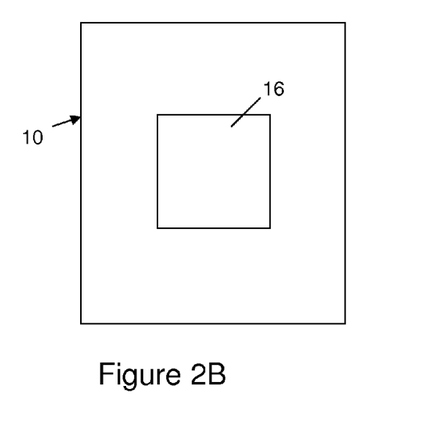

In the first step S1, shown in FIG. 2A, 2B, a flexible foil 10 is provided with a first 11 and a second 12, mutually opposite main side. FIG. 2A shows the foil in cross-section and FIG. 2B shows a top-view of the foil 10, according to B in FIG. 1A. In the embodiment shown the flexible foil 10 comprises a plurality of layers, including at least one adhesive layer 13. The adhesive layer 13 is enclosed between a first and a second release liner 14, 15. The first main side 11 of the flexible foil defines a cavity 16.

Figure 3A:
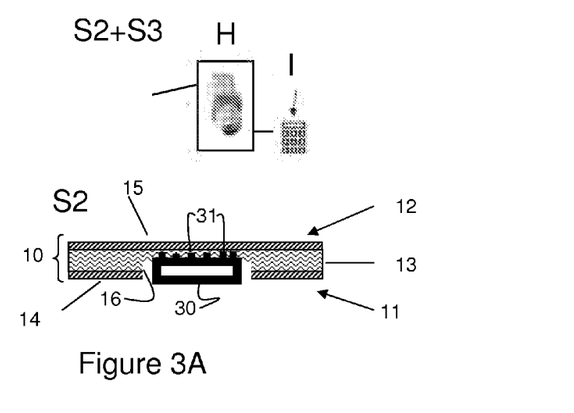
FIG. 3A shows a cross-section of an intermediate product resulting from said steps.
Figure 3B:
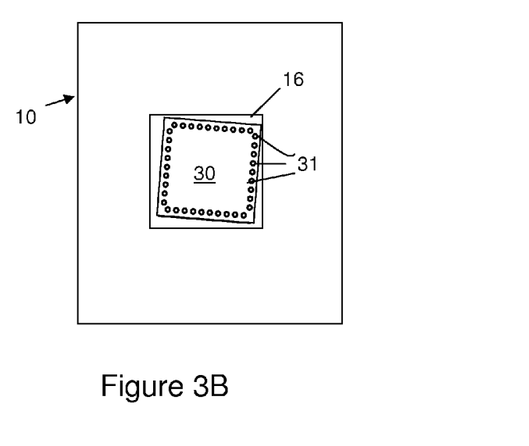
FIG. 3B shows a top-view thereof, FIGS. 4A to 4C schematically show a fourth step of the embodiment, therein

FIG. 3A, 3B show the second step S2 of the method, wherein a component 30 is placed at the first main side 11 of the first foil 10, using a placement apparatus. The component is for example an integrated circuit, also denoted as die or chip.

Alternatively however another component like a battery or a micromechanic device may be positioned. The component 30 has at least one electrical terminal 31 facing towards the second main side 12. By way of example the component 30 has dimensions in a range of 1 to 15 mm. The first foil 10 is substantially larger, e.g. the foil may have a width in the range of tens of centimeters and a length in the order of hundreds of meters or even in the range of kilometers. I.e. the smallest dimension of the foil is at least 10 times larger than the largest dimension of the component. For clarity it is presumed in this case that the foil 10 is transparent, so that the component 30 and the electrical terminals are visible through the foil 10. This is however not necessary. Alternatively the foil may be of an opaque material. As is illustrated in FIGS. 3A, 3B, the component 30 is generally not aligned with the foil 10, as the application of a roll to roll process using flexible materials complicates an accurate placement of separate components. As the foil 10 used here comprises an adhesive layer 13, the component 30 is directly mounted after placement at the layer.

According to the third step of the method the position of the at least one electrical terminal 31 is estimated, e.g. with a computer vision system comprising a camera H and a data processing system I. Several options are possible for carrying out this step S3. For example the computer vision system H,I may determine the position and orientation of the component 30 and knowing its position and orientation, the position of its electrical terminals 31 is known too. If the foil 10 is opaque, the position and orientation of the component 30 may be observed from the first main side. If the foil 10 is transparent the position and orientation of the component 30 may be observed either from the first main side 11 of the foil 10, or from the second main side 12 of the foil. Also it is possible to directly observe the position of the at least one electrical terminal 31 via the foil 10.

Figure 4A:
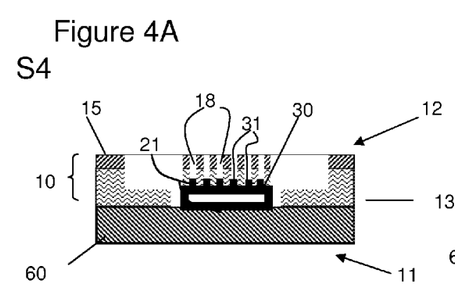
FIG. 4A shows a cross-section of an intermediate product resulting from said step.
Figure 4B:
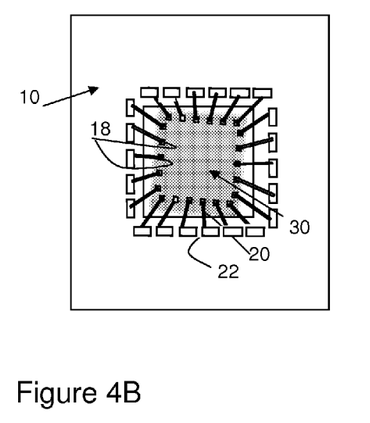
FIG. 4B shows a top-view thereof.
Figure 4C:
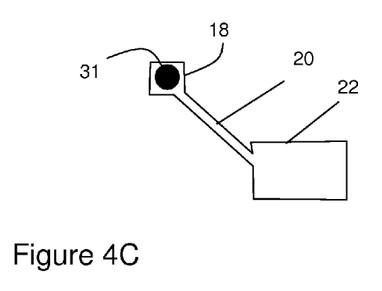
Figure 5A:
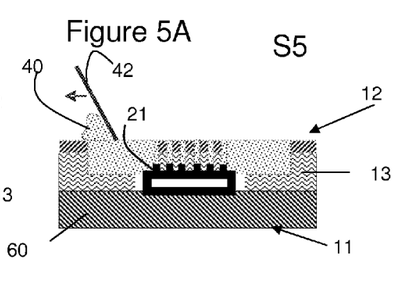
FIG. 5A shows a cross-section of an intermediate product resulting from said step.

Now the position of the at least one electrical terminal 31 is known. In the present embodiment the releaseliner 14 is removed and replaced by a further foil 60 as indicated in FIG. 5A.Subsequently, in step S4 at least one via 18 is applied in the flexible foil 10 at the second main side 12 at said estimated position of the at least one electrical terminal 31. This is illustrated in FIGS. 4A and 4B. In the embodiment shown the component 30 has a plurality of electrical terminals 31, and for each of them a via 18 is provided. However for clarity the principle of the invention is further elucidated for a single electrical terminal 21. FIG. 4C illustrates a detail of FIG. 4B. FIG. 4C shows how the via 18 through the foil 10 is formed opposite the at least one electrical terminal 31. The via 18 communicates with a groove 20 that ends in a relatively wide recess 22. The structure at the first main side 12 of the foil 10, i.e. the via 18 and optionally the groove 20 and the relatively wide recess 22 may be formed by an etching method or a mechanical grinding method. However, preferably the structure is applied by a laser drilling method.

Figure 5B:
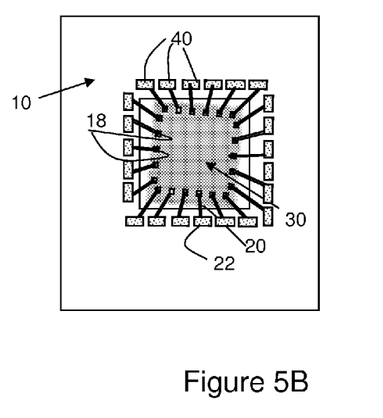
FIG. 5B shows a top-view thereof.

In step S5, illustrated in FIGS. 5A, 5B, an electrically conductive material, 40 such as an isotropic conductive adhesive, e.g. XE3103WLV provided by Emerson is provided in said via 18. In the embodiment shown, a blade 42 is used for this purpose. In this way the via 18, and if present, the groove 18 and the relatively wide recess 22 are filled with the electrically conductive material 40. As a result an electric conductor is formed by the electrically conductive material 40 in the via 18, the groove 20 and the relative wide recess 22. The relatively wide recess 22 may be applied at a reference position of the foil 10, so that the electrical conductor extends between the estimated position (the via) and the reference position. This is particularly useful if the electrical terminals 31 of the component 30 are arranged relatively close together. The electrical connection formed in this way allows to fanout to a contact point, formed by the recess 31 filled with the electrically conductive material 40 having a wider area. This facilitates assembly with a further layer of foil and forming proper electric contacts between the electric terminals 31 of the component 30 and the electric wiring of a further foil. Alternatively the electrical terminals 31 of the component 30 can be electrically connected to a predefined electrical circuit at the second main side 12 of the foil 10.

Figure 5C:
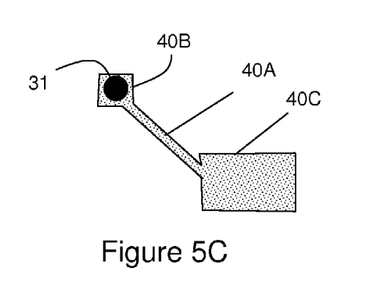

FIG. 5C shows a detail of FIG. 5B. As can be seen in FIG. 5C the electrically conductive material 40 forms a first electric terminal 40B in the via 18, a second electric terminal 40C in the recess 22 and an electrical conductor 40A in the groove 20. The first electric terminal 40B electrically contacts the at least one terminal 31 of the component.

Figure 6A:
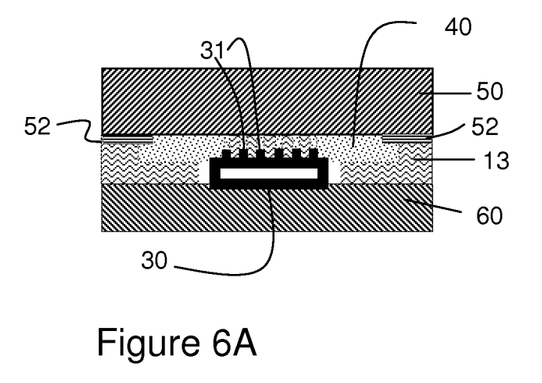
FIG. 6A shows a cross-section of an intermediate product resulting from said optional step and FIG. 6B shows a top-view thereof.
Figure 6B:
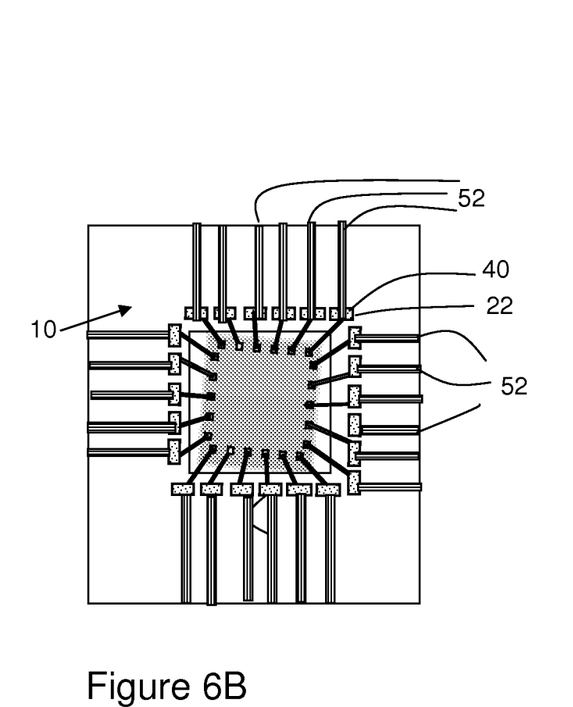

In the embodiment shown a further flexible foil 50 is applied, as illustrated in FIGS. 6A, 6B. The further foil has electrical conductors 52. The further flexible foil 50 is applied with its side carrying the electrical conductors 52, to the adhesive layer 13, after the releaseliner 15 (FIG. 4A) is removed. The electrical conductors 52 are therewith brought into contact with the electrical contacts formed by the electrical conductive material 40 in the relatively wide recesses 22. The circuitry formed by these electrical contacts and the electrical conductors 52 is now protected as it is embedded between the flexible foil 50 and the adhesive layer 13. The foils 50 and 60 together encapsulate the component 30. Therewith the component 30 is in the neutral line of the flexible product, so that the component 30 is minimally distorted when the flexible product is bended. Moreover, the adhesive layer 13 provides for shock absorption of the component 30.

Figure 7:
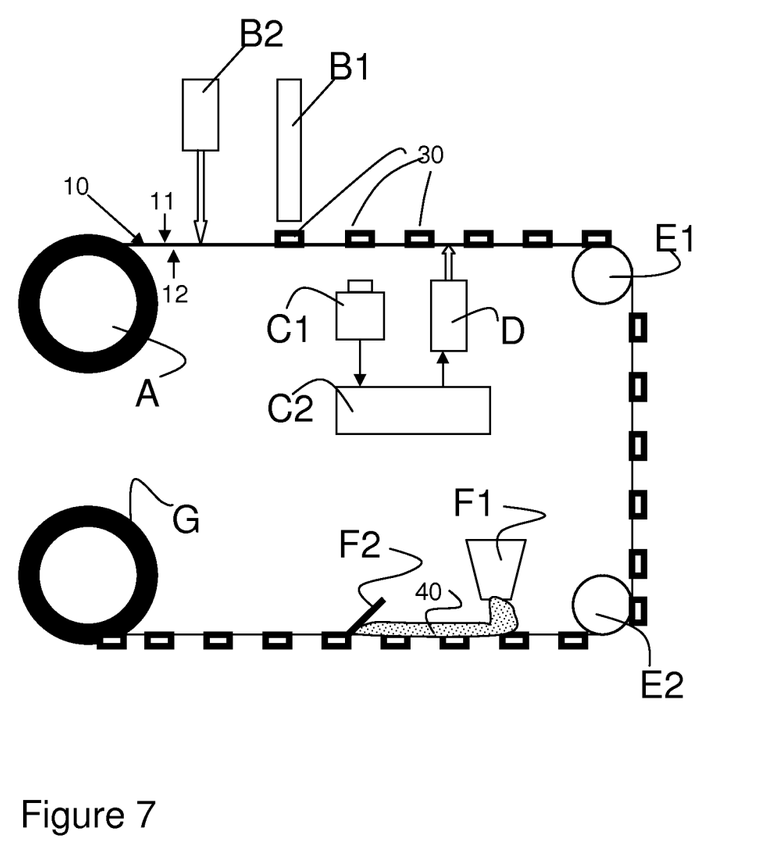
FIG. 7 shows an embodiment of a manufacturing apparatus according to the invention, FIGS. 8A and 8B schematically show a first step of an alternative embodiment of a method according to the invention, therein

FIG. 7 schematically shows an apparatus for manufacturing a flexible electronic product.

As shown in FIG. 7, the apparatus comprises a first facility A for providing a flexible foil 10 with a first 11 and a second 12, mutually opposite main side.

The apparatus has a second facility B1 for placing a component 30 at the flexible foil 10 at the first main side 11. The second facility B1 can be a conventional placement facility. The component 30 has at least one electrical terminal 31 (not shown in FIG. 7) facing towards the second main side 12 of the foil 10. In the embodiment shown, the apparatus is further provided with a facility B2 for forming a cavity in the first main side 11 of the foil 10. As the component 30 is submerged in the cavity 16 (FIGS. 2A, 2B, 3A, 3B), the component is less prone to damage. Furthermore, the cavity in the foil 10 facilitates the placement of the component 30, here in particular because forming of the cavity exposes the adhesive layer 13 to which the component 30 is attached. Although in FIG. 7, the components 30 protrude out of the foil 10, in practice they may be completely submerged in the cavity provided by the facility B2. The apparatus comprises a third facility for estimating a position of the at least one electrical terminal of the component 30. In the embodiment shown the third facility includes a camera C1 and an image processing facility C2. The image processing facility C2 may be carried out as dedicated hardware, but may alternatively be a general purpose processor provided with suitable software.

A fourth facility D is present for providing at least one via in the flexible foil 10 at the second main side at the estimated position of the at least one electrical terminal of the component 30. Although various options are possible to provide the at least one via into the foil 10, it is most preferred to apply the via by laser drilling, as in that case a mechanical contact with the foil is avoided. The facility D may additionally provide other structures at the second main side 12 of the foil 10, such as grooves leading to the via, widened recesses etc.

The foil 10 with the components 30 thereon is then guided along guidance rolls E1, E2 to a fifth facility F1, F2 for providing an electrically conductive material 40 in said via. The fifth facility comprises a dispenser F1 for dispensing the electrically conductive material 40 onto the second main surface 12 of the foil 10 and the blade F2 for removing superfluous electrically conductive material 40. In this step any recessed portion of the second side of the foil 10 may be provided with the electrically conductive material 40, so that an electrically conductive structure is formed. Other methods may be used to apply the electrically conductive material 40, such as electroless plating, dispensing etc.

After removal of the superfluous material 40 the foil with the components 30 is rolled upon a storage roll G. The foil 10 may serve as an end product. It is not strictly necessary that the first and the second main side are provided with a further foil. However, for improving the robustness of the product or for obtaining more advanced products it is preferred that such further foils are present. Accordingly the foil 10 provided with the components 30 may be further processed in another manufacturing facility. Alternatively these steps may be immediately carried out in the facility of FIG. 7.

In the embodiment of the method described above, manufacturing of the flexible electronic product is strongly facilitated by the presence of the adhesive layer 13, as the adhesive layer adheres the component 30 immediately after placement. The adhesive layer 13 further serves to adhere the foils 50, 60.

Other options are possible however, as is illustrated by the following embodiment of a method according to the present invention.

Figure 8A:
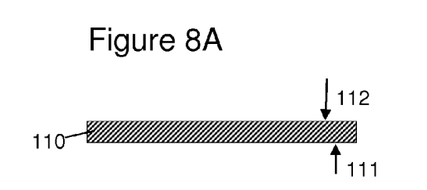
FIG. 8A shows a cross-section of an intermediate product resulting from said first step.
Figure 10A:
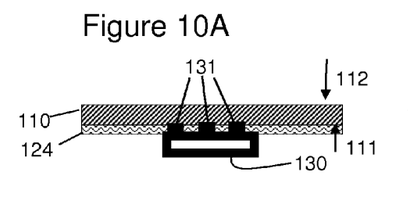
FIG. 10A shows a cross-section of an intermediate product resulting from said second step.
Figure 10B:
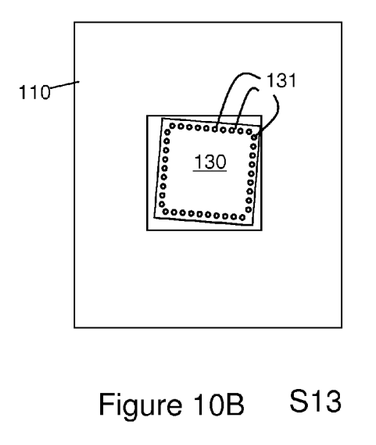
Figure 11A:
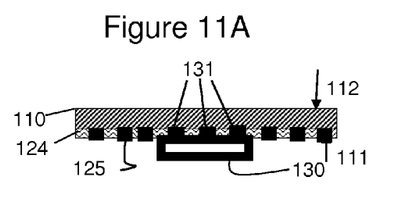
FIG. 11A shows a cross-section of an intermediate product resulting from said second step.

FIGS. 8A,B to FIG. 11A,B show an alternative embodiment of a method according to the invention. Parts therein corresponding to those of FIG. 1-7 have a reference number that is 100 higher.

Figure 8B:
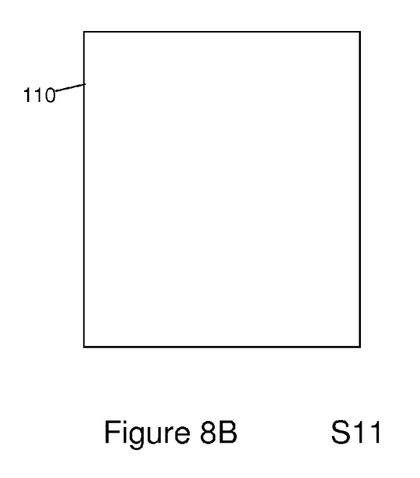

In step S11, shown in FIG. 8A, 8B a flexible foil 110 is provided with a first and a second, mutually opposite main side 111, 112.

Figure 9A:
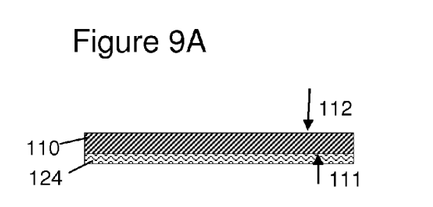
FIG. 9A shows a cross-section of an intermediate product resulting from said second step.
Figure 9B:
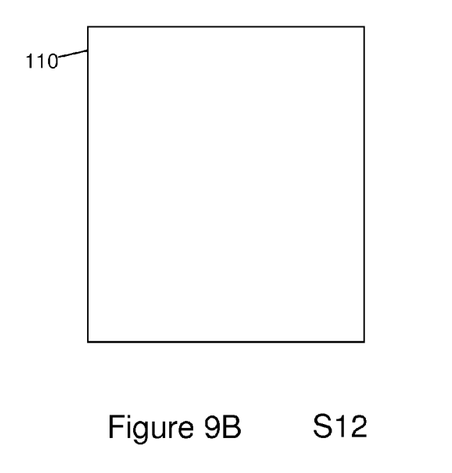

In step S12, shown in FIG. 9A, 9B an adhesive 124 is provided at a main side 111 of the foil 110.

In step S13, shown in FIG. 10A, 10B a component 130 is placed at the first main side 111 of the flexible foil 110. The component has at least one electrical terminal 131 facing towards the second main side 112. In the embodiment shown the component has a plurality of terminals 131.

Subsequently a position is estimated of the at least one electrical terminal 131 by a method as described above.

Figure 11B:
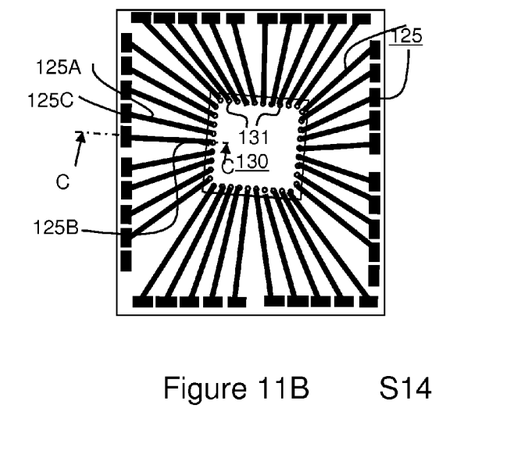
FIG. 11B shows a top-view thereof.

In step S14, shown in FIG. 11A, 11B a conductive path 125A to the at least one electrical terminal 131 is adaptively formed. The estimated position is used therewith. The conductive path 125A is formed by converting the conductivity properties in a conversion zone 125 of the adhesive 124. The position and/or orientation of the conversion zone is dependent on the estimated position.

As shown in FIG. 11B this is particularly relevant for assembly of components having a relatively high number of outputs that are densely arranged. The present invention allows for a reliable connection between these densely arranged but inaccurately positioned electrical terminals 131 and further terminals 125C at the foil 110, which may be part of a courser defined electrically conductive structure.

Figure 11C:
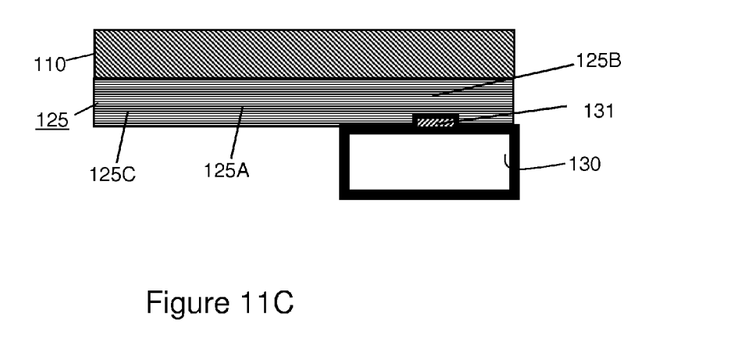

FIG. 11C shows a detail of the connection 125A formed between such a terminal 131 of the component 130 and a terminal 125C at the foil.

Depending on the type of adhesive, the conversion of the conductivity properties of the adhesive can be realized by various mechanisms. Some examples of these mechanisms are given below.

In one type of adhesive, a so-called non-conductive Anisotropic Conductive Adhesive (ACA), the adhesive, comprising conductive particles, is compressed until the percolation threshold of the particles is surpassed, resulting in a conductive structure.

In another type of adhesive pyrolysis takes place. Pyrolysis causes a decomposition of the adhesive under the influence of heat into, among others, an electrically conducting material, e.g. an electrically conducting carbon material. This type of adhesives can be selected from the group of non-conductive organic thermoplastic adhesives and non-conductive organic adhesives.

To yet another type of adhesive, comprising conductive particles and a photocatalyst, light or other em-radiation is applied. The conductive particles are embedded in an insulating shell. Photo-absorption causes the insulating shell to rupture, causing a conversion of the adhesive from non-conductive to conductive. This mechanism can also take place under the influence of heat, in which case the heat causes the non-conductive shells to rupture.

Also a combination of the types of adhesive mentioned above is also possible.

One of the adhesives contemplated comprises Emerson XE3103WLV isotropic conducting adhesive, an epoxy adhesive with 76% by weight silver content. In one embodiment, the whole surface of the foil 110 is covered by a convertible adhesive 124. However, to save costs, the expensive convertible adhesive can only be provided on and around the terminals 131, whereas in other areas a cheaper, non-convertible adhesive can be provided. In this way, special I/O fields may create substructures in which an array of individual contacts with a high resolution (fine pitch) is defined.

In one embodiment, the adhesive 124 is non-conductive and the conductivity properties of the adhesive are converted from non-conductive to conductive. In FIGS. 9A, 9B, 10A, 10B, 11A, 11B an embodiment is shown wherein the conductive conversion component is converted within a channel shaped conversion zone 125A between conductive terminals 125B and 125C, providing an electrical interconnect between the corresponding terminals. As shown in more detail in FIG. 11C, conductive terminal 125B is arranged opposite the at least one electric terminal 131 of the component 130.

In another embodiment, the conductive adhesive is converted from conductive to non-conductive. In this case, the electrical interconnect is formed by a conversion from conductive to non-conductive within two conversion zones encapsulating the conductive adhesive between two non-conductive parts of the adhesive, providing an electrical interconnect between the corresponding terminals.

In an embodiment heat and light are provided within the conversion zone by a laser. According to the desired conductive structure, the laser scanning and intensity has to be steered over the contact area. In one embodiment, the laser is guided by a conversion unit present in the manufacturing system for multi-foil systems on basis of adjustment signals. The adjustment signals indicate the relative position of the at least one terminal of the component with respect to the foil. In one embodiment, the conversion unit receives the adjustment signal by reading a pattern of marks provided on the component. In yet another embodiment, the laser is guided by a soft mask. A soft mask is a stream file that provides the parameters for the laser scanning. It can be combined with image recognition on already present structures. In another embodiment the light is provided through lithographic techniques.

To create electrical interconnects, the em-radiation or the electron beam radiation must be able to reach the conversion zone. At the location of the electronic component the radiation may reach the conversion zone via the foil. Hence, in order not to hinder the em-radiation or the electron beam radiation the foil should be at least partially transparent. Suitable materials for that purpose are for example PolyEthylene Naphthalate (PEN), PolyEthylene Terephthalate (PET). Before assembly with the component, the foil may already be provided with a transparent electrically conductive structure, e.g. from Indium Tin Oxide (ITO). ITO can be applied to a biaxially oriented PET film by sputter deposition. Other materials are however possible. In one embodiment, materials with a difference in refractive indexes are used to focus the intensity of the em-radiation. Portions of the adhesive material outside a location where the component is mounted may be radiated directly from the first main side of the foil.

The present invention can be used in a manufacturing process, e.g. a reel-to-reel, roll-to-roll or a sheet-to-sheet manufacturing process. In such a process, inaccuracies in the positioning of the various elements will be inevitable, resulting in a positioning error.

Many error sources may contribute to the positioning error of the component. In the following some of these sources will be discussed.

One error source contributing to the positioning error is inaccuracy in the alignment of the component with the foil. This inaccuracy can occur both longitudinal and transversal to the direction of movement of the foils.

Yet another possible error source contributing to the positioning error occurs during the manufacturing of the foil. The foil may comprise a pattern of terminals that may differ from the designed pattern.

Many other error sources contribute to the positioning error. The significance of the contribution of the various sources may depend on the specific embodiment of the invention.

If the present invention is part of a manufacturing process, the conversion of the adhesive will preferably be done with a contactless mechanism. Heat, light or other em-radiation may be provided by a laser or an electron beam radiation source may be used. However, in certain situations, e.g. when heat is a critical factor, a stylus may be used to apply pressure to the conversion zone.

One of the advantages of the present invention is that positioning errors, e.g. due to overlay inaccuracies during assembly of the component with the foil may be overcome by adaptively adjusting the conversion zone both in size and shape to form interconnects between corresponding terminals. Such adaptive interconnects may be advantageous for the assembly process.

During assembly of the component with the, certain overlay inaccuracies may occur. If it is not possible to provide adaptive interconnects, these overlay inaccuracies may be compensated for during assembly by slightly deforming the foil, e.g. by stretching the foil in a certain direction. However, such deformations may lead to residual stresses in the final laminated device which may be harmful to the functional structures or may lead to unwanted curling of the device.

Using adaptive interconnects may lower the demand for overlay precision during assembly. It could even make any stress inducing mechanical compensations during assembly obsolete. Moreover, very local overlay inaccuracies, which might not be correctable by global foil deformation during assembly, may be compensated for by adaptive interconnects.

Providing adaptive interconnects may be implemented in a reel-to-reel manufacturing process, e.g. in a control loop. First, local overlay inaccuracies in the system formed by the component and the foil may be detected e.g. optically with conventional image analysis techniques, like video camera image recognition. This inaccuracy information may then be used to calculate an adjustment signal, indicative of a positioning error of the at least one terminal and the foil. Finally, the adjustment signal is used to steer a laser over the surface to adaptively write interconnects into the conversion material.

Figure 12A:
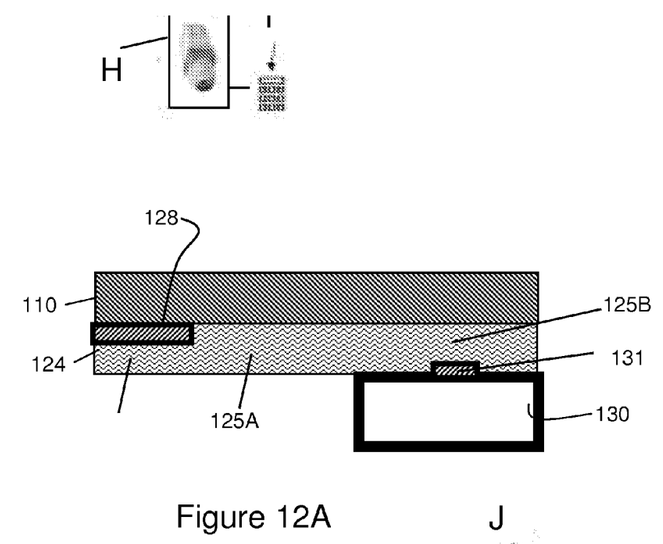
Figure 12B:
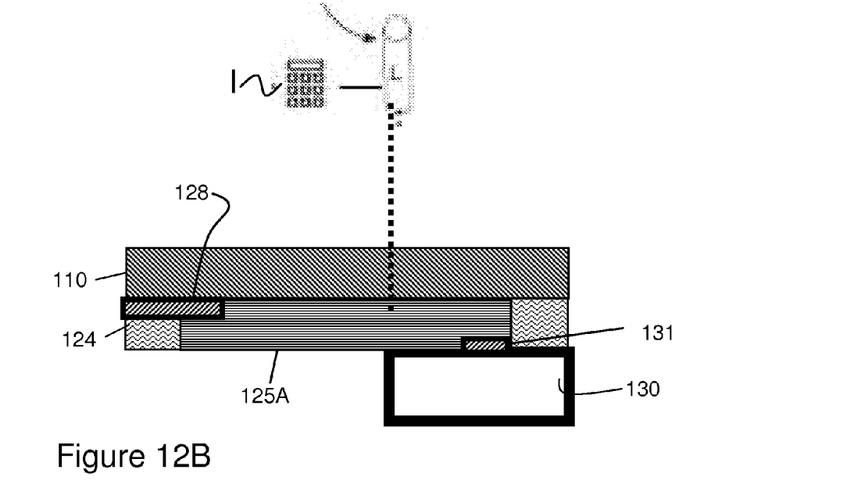

The adaptive interconnect process is schematically shown in FIGS. 12A, 12B. In the first process step, shown in FIG. 12A, detecting means H may detect local overlay inaccuracies in the system formed by the component and the foil. Calculating means I may calculate the adjustment signal based on the accuracy information. In the second step, shown in FIG. 12B, a laser J writes the adaptive interconnects into the conversion material guided by the adjustment signal provided by the calculating means I.

The foil 110 or another foil laminated therewith may already comprise an electric circuitry before assembly with the component 130. After assembly of the component a method according to the invention may be used to connect the one or more terminals of the component to the predefined electric circuitry.

Aspects of various embodiments of the method according to the invention may be combined. For example, the method described with reference to FIGS. 8 to 12 may be used to adaptively apply an electrically conductive pattern at the second main side of the foil. The so obtained electrically conductive pattern may be connected to one or more electrical terminals of the component by electrical conductors through the foil obtained with the method of FIGS. 2-6.

In still another embodiment a conductive pattern is adaptively provided by inkjet printing, for example using a Silver filled nano ink.

Figure 13A:
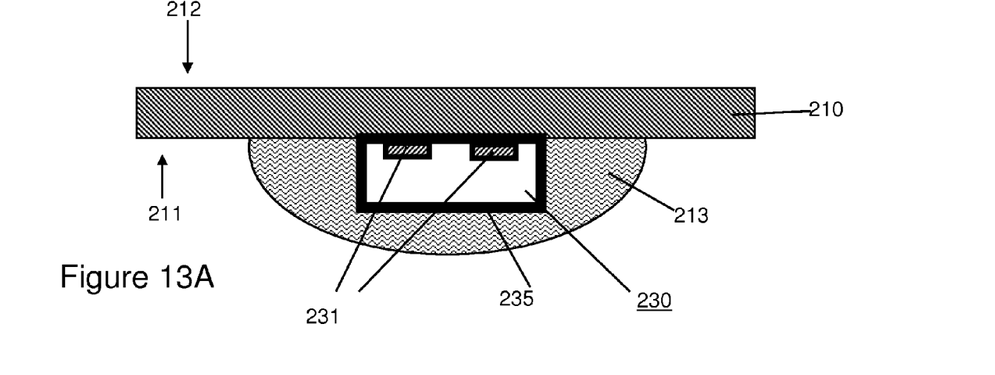
FIG. 13A shows a first step in a still further alternative embodiment of a method according to the present invention.
Figure 13B:
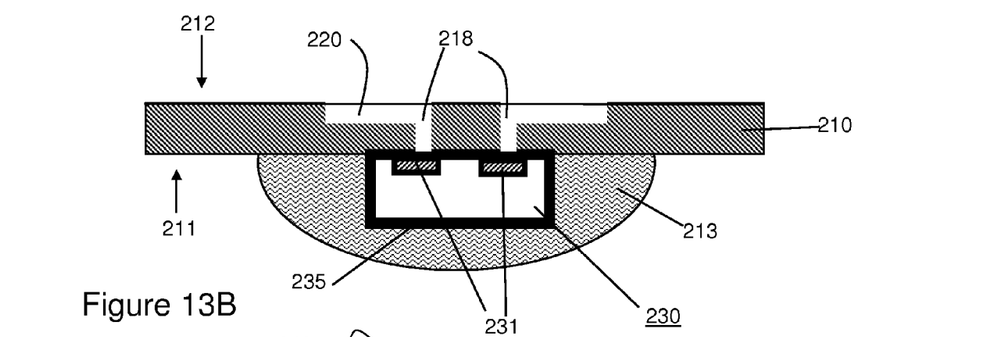
FIG. 13B shows a second step in said embodiment.
Figure 13C:
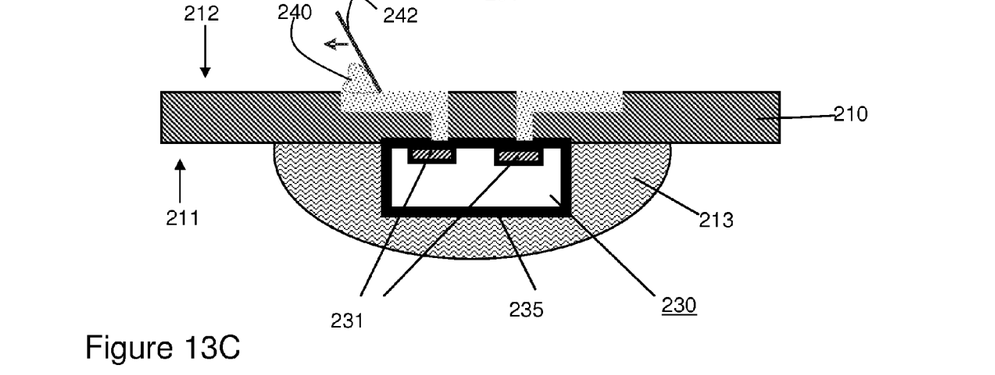
FIG. 13C shows a third step in said embodiment.

In FIGS. 13A to 13C, parts corresponding to those in FIGS. 4A and 5A have a reference number that is 200 higher. FIGS. 13A to 13C show a still further embodiment of a method according to the present invention. In this embodiment of the method a so-called bumpless component, e.g. a bumpless chip 230 is placed at the first main side 211 of the flexible foil 210. The bumpless component 230 is then adhered to the foil 210 with an adhesive 213 that extends over the free surface 235 of the component 230 to the surface at the first main side 211 of the flexible foil 210. The best adherence of the component 230 is obtained if the adhesive 213 fully encapsulates the component 230 and is adhered to said surface at the full circumference of the component 230. After application of the component 230 to the foil 210, the position of its electric terminals 231 is determined using a computer vision system for example.

Subsequently, as shown in FIG. 13B, vias 218 are applied that provide an access to the electric terminals 231 as well as grooves 220 leading to the vias 218.

FIG. 13C shows how the grooves 220 and the vias 218 of FIG. 13B are filled with an electrically conductive paste.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfill the functions of several items recited in the claims. Any reference signs in the claims should not be construed as limiting the scope.

The invention claimed is:

1. Method for manufacturing a flexible electronic product, the method comprising the steps of
   providing (S1) a flexible foil (10; 110) with a first and a second, mutually opposite main side (11, 12; 111, 112),
   placing (S2) a component (30; 130) at the first foil at the first main side (11; 111), the component having at least one electrical terminal (31; 131) facing towards the second main side (12; 112)
   estimating (S3) a position of the at least one electrical terminal (131) with a computer vision system comprising a camera (H) and a data processing system (I),
   adaptively forming (S4) a conductive path (40A, 40B, 40C) to the at least one electrical terminal, based on said estimated position, wherein said step of adaptively forming (S4) a conductive path comprises
   forming at least one via (18) in the flexible foil (10) at the second main side (12) at said estimated position,
   providing (S5) an electrically conductive material (40) in said via, and further comprising the step of applying an electric conductor (40A) between a terminal (40C) at a reference position and the electrically conductive material in the via (18) at said estimated position, wherein the electrical conductor (40A) is applied by applying at least one groove (20) between the at least one via (18) and the reference position, and filling the groove (18) with an electrically conductive material (40).

2. Method according to claim 1, wherein the electrically conductive material (40) is applied by a squeegee-based filling process.

3. Method according to claim 1, wherein a cavity (16) is applied in the first foil (10) at its first main side (11), and the component (30) is arranged in the cavity (16).

4. Method according to claim 1, wherein the first foil (10) comprises a plurality of layers, including at least one adhesive layer (13).

5. Method according to claim 1, characterized by
   applying a further flexible foil (50) at the second side (12) of the flexible foil (10), the further flexible foil (50) comprising at least one electrical conductor (52), wherein an electrical contact is formed between the at least one electrical conductor and the at least one terminal (31) via the electrical conductive material (40) in the via (18) and the recess (22).

6. Method according to claim 1, wherein a main side of the flexible foil is provided with a patterned electrically conductive layer.

7. Method according to claim 1, wherein the at least one electrical conductor of the second foil is applied by screen printing.

8. Method according to claim 1, wherein the first main side (11) of the flexible foil (10) is provided with a further flexible foil (60).

9. Method for manufacturing a flexible electronic product, the method comprising the steps of
   providing (S1) a flexible foil (10; 110) with a first and a second, mutually opposite main side (11, 12; 111, 112),
   placing (S2) a component (30; 130) at the first foil at the first main side (11; 111), the component having at least one electrical terminal (31; 131) facing towards the second main side (12; 112)
   estimating (S3) a position of the at least one electrical terminal (131) with a computer vision system comprising a camera (H) and a data processing system (I),
   adaptively forming (S4) a conductive path (40A, 40B, 40C) to the at least one electrical terminal, based on said estimated position, wherein the step of adaptively forming (S4) a conductive path comprises
   providing (S11) an adhesive (124) at a main side (111) of the foil (110), and
   converting (S14) the conductivity properties in a conversion zone (125) of said adhesive (124), the position and/or orientation of the conversion zone being depending on the estimated position.

10. Method according to claim 9, wherein the conversion of the conductivity properties comprises providing heat, em-radiation, electron beam radiation, pressure or a combination thereof to the conversion zone.

11. The method of claim 9, wherein the conductivity properties of said adhesive are converted from non-conductive to conductive.

12. The method of claim 10, wherein the conductivity properties of said adhesive are converted from conductive to non-conductive.

13. Apparatus for manufacturing a flexible electronic product, the apparatus comprising
- a storage roll (A) for providing a flexible foil (10), the flexible foil having a first and a second, mutually opposite main side (11, 12), the apparatus further comprising, subsequently arranged along a path of the flexible foil,
- a component placement facility (B1) for placing a component (30) at the flexible foil (10) at the first main side (11), the component (30) having at least one electrical terminal (31) facing towards the second main side (12),
- a camera (C1) to observe the position and orientation of a component or an electrical terminal thereof, said camera being coupled to a data processing system (I) for estimating a position of the at least one electrical terminal (31),
- a drilling unit (D) controlled by the data processing system for forming a via through the foil opposite the at least one electrical terminal and for forming a groove between the at least one via and a reference position; and
- filling means for filling said via and said groove with an electrically conductive material, to therewith adaptively forming a conductive path to the at least one electrical terminal, based on said estimated position.

14. Apparatus for manufacturing a flexible electronic product, the apparatus comprising
- a storage roll (A) for providing a flexible foil (10), the flexible foil having a first and a second, mutually opposite main side (11, 12), the apparatus further comprising, subsequently arranged along a path of the flexible foil,
- a component placement facility (B1) for placing a component (30) at the flexible foil (10) at the first main side (11), the component (30) having at least one electrical terminal (31) facing towards the second main side (12),
- an adhesive providing facility for providing an adhesive (124) at a main side (111) of the foil (110)
- a conversion facility (F1) for converting (S14) the conductivity properties in a conversion zone (125) of said adhesive (124), the position and/or orientation of the conversion zone being depending on a position of the at least one electrical terminal estimated by a data processing system, therewith adaptively forming a conductive path to the at least one electrical terminal, based on said estimated position,
- the apparatus further comprising a camera (C1) to observe the position and orientation of the component or an electrical terminal thereof, said camera being coupled to the data processing system and being arranged along the path of the flexible foil between the component placement facility and the conversion facility.

* * * * *

UNITED STATES PATENT AND TRADEMARK OFFICE
CERTIFICATE OF CORRECTION

PATENT NO. : 8,510,934 B2  Page 1 of 1
APPLICATION NO. : 13/140387
DATED : August 20, 2013
INVENTOR(S) : Brand et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 60 days.

Signed and Sealed this

Fifteenth Day of September, 2015

Michelle K. Lee
*Director of the United States Patent and Trademark Office*